(12) United States Patent
Bateman et al.

(10) Patent No.: US 8,921,149 B2
(45) Date of Patent: Dec. 30, 2014

(54) ALIGNING SUCCESSIVE IMPLANTS WITH A SOFT MASK

(75) Inventors: Nicholas P. T. Bateman, Reading, MA (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 263 days.

(21) Appl. No.: 13/034,354

(22) Filed: Feb. 24, 2011

(65) Prior Publication Data

US 2011/0217810 A1  Sep. 8, 2011

Related U.S. Application Data

(60) Provisional application No. 61/310,431, filed on Mar. 4, 2010.

(51) Int. Cl.
*H01L 21/266* (2006.01)
*H01L 21/265* (2006.01)
*H01L 31/068* (2012.01)

(52) U.S. Cl.
CPC ........ *H01L 21/266* (2013.01); *H01L 21/26513* (2013.01); *H01L 31/0682* (2013.01); *Y02E 10/547* (2013.01)
USPC ............................................. 438/96; 438/57

(58) Field of Classification Search
USPC .......................................................... 438/96
See application file for complete search history.

(56) References Cited

U.S. PATENT DOCUMENTS

| | | | |
|---|---|---|---|
| 4,106,954 A | 8/1978 | de Brebisson et al. | |
| 4,255,212 A | 3/1981 | Chappell et al. | |
| 5,528,058 A | 6/1996 | Pike, Jr. et al. | |
| 7,190,458 B2 | 3/2007 | Borden et al. | |
| 7,727,866 B2 | 6/2010 | Bateman et al. | |
| 7,776,727 B2 | 8/2010 | Borden | |
| 7,820,460 B2 | 10/2010 | Sullivan et al. | |
| 2004/0025932 A1 | 2/2004 | Husher | |
| 2009/0227094 A1 | 9/2009 | Bateman et al. | |
| 2009/0227095 A1* | 9/2009 | Bateman et al. | 438/514 |
| 2009/0308439 A1* | 12/2009 | Adibi et al. | 136/255 |
| 2010/0154870 A1 | 6/2010 | Bateman et al. | |
| 2010/0184243 A1 | 7/2010 | Low et al. | |

FOREIGN PATENT DOCUMENTS

| | | |
|---|---|---|
| EP | 0875945 A2 | 11/1998 |
| JP | 4-115517 A | 4/1992 |
| JP | 4115517 A | 4/1992 |
| WO | 2009033134 A2 | 3/2009 |
| WO | 2010108151 A1 | 9/2010 |

* cited by examiner

*Primary Examiner* — Charles Garber
*Assistant Examiner* — Stanetta Isaac

(57) ABSTRACT

A first species selectively dopes a workpiece to form a first doped region. In one embodiment, a selective implant is performed using a mask with apertures. A soft mask is applied to the first doped region. A second species is implanted into the workpiece to form a second implanted region. The soft mask blocks a portion of the second species. Then the soft mask is removed. The first species and second species may be opposite conductivities such that one is p-type and the other is n-type.

25 Claims, 4 Drawing Sheets

ALIGNING SUCCESSIVE IMPLANTS WITH A SOFT MASK

CROSS-REFERENCE TO RELATED APPLICATIONS

This application claims priority to the provisional patent application entitled "Aligning Successive Implants with a Soft Mask," filed Mar. 4, 2010 and assigned U.S. App. No. 61/310,431, the disclosure of which is hereby incorporated by reference.

FIELD

This invention relates to solar cells and, more particularly, to solar cells formed using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Solar cells are one example of a device that uses silicon workpieces. Any reduced cost to the production of high-performance solar cells or any efficiency improvement to high-performance solar cells would have a positive impact on the implementation of solar cells worldwide. This will enable the wider availability of this clean energy technology.

Solar cells typically consist of a p-n semiconducting junction. FIG. 1 is a cross-sectional view of an interdigitated back contact (IBC) solar cell. In the IBC solar cell 205, the junction is on the back or non-illuminated surface. In this particular embodiment, the IBC solar cell 205 has an n-type base 206, an n+ front surface field 207, a passivating layer 208, and an anti-reflective coating (ARC) 209. The passivating layer 208 may be $SiO_2$ in one instance, though other dielectrics may be used. Photons 214 enter the IBC solar cell 205 through the top (or illuminated) surface, as signified by the arrows. These photons 214 pass through the ARC 209, which is designed to minimize the number of photons 214 that are reflected away from the IBC solar cell 205. The ARC 209 may be comprised of a $SiN_x$ layer in one instance. The photons 214 enter through the n+ front surface field 207. The photons 214 with sufficient energy (above the bandgap of the semiconductor) are able to promote an electron within the valence band of the semiconductor material to the conduction band. Associated with this free electron is a corresponding positively charged hole in the valence band.

On the back side of the IBC solar cell 205 is an emitter region 215. The doping pattern of the emitter region 215 is alternating p-type and n-type dopant regions in this particular embodiment. The n+ back surface field 204 may be approximately 450 μm in width and doped with phosphorus or other n-type dopants. The p+ emitter 203 may be approximately 1450 μm in width and doped with boron or other p-type dopants. This doping may enable the junction in the IBC solar cell 205 to function or have increased efficiency. This IBC solar cell 205 also includes a passivating layer 212, p-type contact fingers 210, n-type contact fingers 211, and contact holes 213 through the passivating layer 212.

To form the IBC solar cell, at least two patterned doping steps may be required. These patterned doping steps need to be aligned to prevent the p+ emitter 203 and the n+ back surface field 204 from overlapping. In one instance, the alignment needs to be between approximately 5-50 μm. Poor alignment or overlapping may be prevented by leaving a gap between the p+emitter 203 and the n+ back surface field 204, but this may degrade performance of the IBC solar cell depending on the size of the gap. Even when properly aligned, such patterned doping may have large manufacturing costs. For example, photolithography or hard masks (such as an oxide) may be used, but both are expensive and require extra process steps. Furthermore, it may be difficult to construct a shadow mask with long, thin fingers that may be used, for example, with a boron implant. Therefore, there is a need in the art for an improved method of doping solar cells and, more particularly, an improved method of doping IBC solar cells using ion implantation.

SUMMARY

According to a first aspect of the invention, a method of manufacturing a workpiece is provided. The method comprises selectively doping a first species into a workpiece to form at least one first doped region. A soft mask is applied to the first doped region. A second species is implanted into the workpiece. The second species forms at least one second doped region and the soft mask blocks a portion of the second species. The soft mask is then removed.

According to a second aspect of the invention, a method of manufacturing a workpiece is provided. The method comprises selectively implanting an n-type species into a workpiece through a mask defining at least one aperture. The mask is disposed a distance from the workpiece. The n-type species forms at least one first implanted region. A soft mask is applied to the first implanted region. A p-type species is implanted into the workpiece. The p-type species forms at least one second implanted region and the soft mask blocks a portion of the p-type species. The soft mask is then removed.

According to a third aspect of the invention, a method of manufacturing a workpiece is provided. The method comprises selectively implanting a p-type species into a workpiece through a mask defining at least one aperture. The mask is disposed a distance from the workpiece. The p-type species forms at least one first implanted region. A soft mask is applied to the first implanted region. An n-type species is implanted into the workpiece. The n-type species forms at least one second implanted region and the soft mask blocks a portion of the n-type species. The soft mask is then removed.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this method are described herein in connection with an ion implanter. Beamline ion implanters, plasma doping ion implanters, focused plasma systems, systems that modulate a plasma sheath, or flood ion implanters may be used. However, gaseous diffusion, furnace diffusion, laser doping, other plasma processing tools, or other methods known to those skilled in the art also may be used for the blanket or selective implant or doping steps. While specific n-type and p-type dopants are listed, other n-type or p-type dopants may be used instead and the embodiments herein are not limited solely to the dopants listed. Furthermore, while one particular embodiment of a solar cell is specifically listed, embodiments of this process may be applied to other solar cell designs or even other workpieces such as semiconductor wafers or flat panels. Thus, the invention is not limited to the specific embodiments described below.

Figure 1:
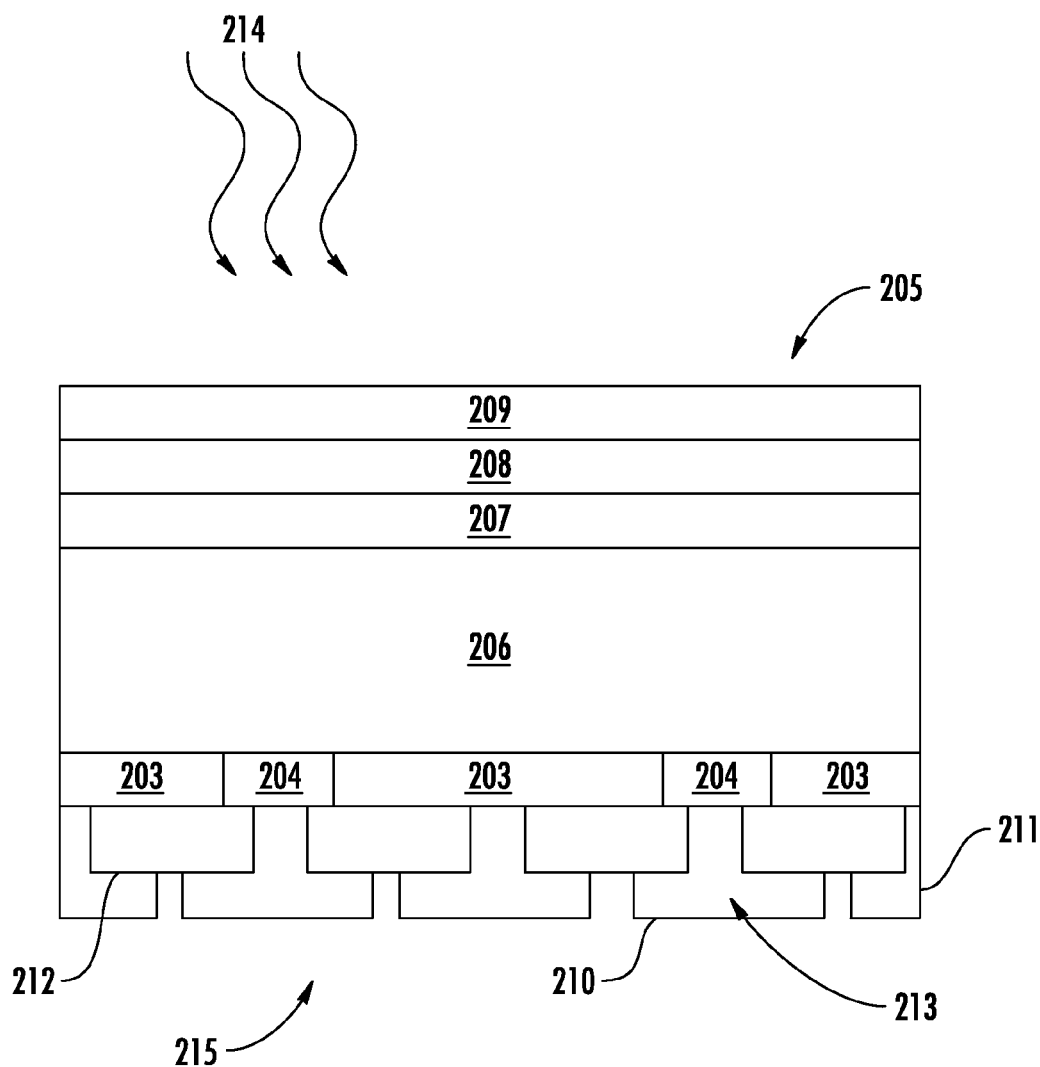
FIG. 1 is a cross-sectional view of an IBC solar cell.
Figure 2A:
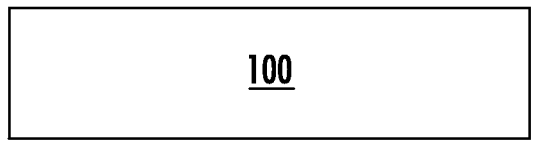
FIGS. 2A-E are cross-sectional views of a first method to form an IBC solar cell.
Figure 2B:
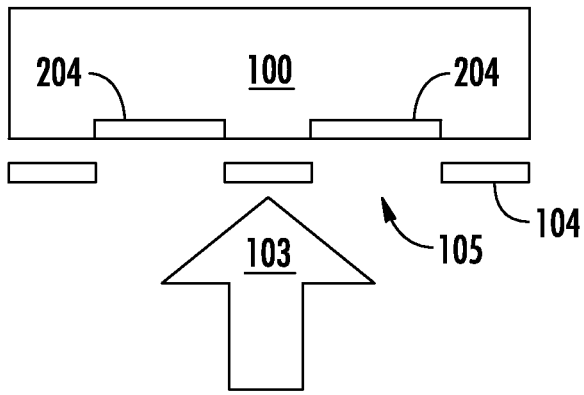

FIGS. 2A-E are cross-sectional views of a first method to form an IBC solar cell. In FIG. 2A, a workpiece 100 is provided. The workpiece 100 may be, for example, a silicon substrate that will be formed into a solar cell. In FIG. 2B, the workpiece 100 is implanted using ions of an n-type species 103, though other selective doping methods may be used. In this embodiment, the n-type species 103 is implanted through the apertures 105 of a mask 104. The mask 104 may be a stencil or shadow mask, for example, and may be disposed a distance from the workpiece 100. The mask 104 also may be disposed on the workpiece 100. This mask 104 prevents n-type species 103 from implanting the workpiece 100 except in the areas of the n+ back surface fields 204. In one embodiment, the n-type species 103 is phosphorus or arsenic and implanted at a dose of approximately $1E14$ $cm^{-2}$ to $2E16$ $cm^{-2}$. Such an implant may amorphize the crystal lattice of the workpiece 100 in the n+ back surface fields 204 in one instance. If amorphization occurs, the n+ back surface fields 204 may be visible to either the human eye or to a pattern recognition system. In another instance, amorphization does not occur, but the n+ back surface fields 204 may still be visible with certain pattern recognition systems. These pattern recognition systems may use, for example, light in the ultraviolet (UV) or infrared (IR) ranges or light in different colors to find the n+ back surface fields 204.

Figure 2C:
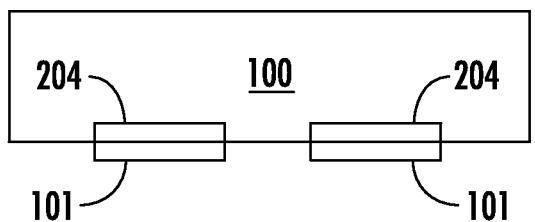

In FIG. 2C, a soft mask 101, which may be an organic material applied to the workpiece 100, is aligned to the n+ back surface fields 204. The soft mask 101 in one instance is an ink, wax, or an epoxy. For example, a polyvinyl acetate (PVA), poly(methyl methacrylate) (PMMA), poly(methyl glutarimide) (PMGI), phenol formaldehyde resin (such as DNQ/Novolac), SU-8 epoxy, or photoresist may be used. This soft mask 101 may be applied using, for example, an inkjet printer, a screen printer, offset lithography, or a rubber stamp. The application of the soft mask 101 occurs in a single step in one embodiment. Thus, this soft mask 101 may be applied in the exact shape of the n+ back surface field 204 without extra patterning steps. Thermal curing or UV curing of the soft mask 101 may harden it, though in other embodiments the soft mask 101 may dry or cool and harden. In an alternate embodiment, the soft mask 101 is a tape that has a sticky side or is applied using glue.

The soft mask 101 may have a thickness of approximately 1 μm above a surface of the workpiece 100. In other embodiments, the soft mask 101 has a thickness between approximately 100 nm and 50 μm or less than 100 nm above a surface of the workpiece 100. Certain soft mask 101 materials may be unable to print less than 100 nm without losing edge fidelity, but other materials are capable of being printed at such a thickness.

In one particular embodiment, the position of the amorphized n+ back surface fields 204 are optically measured and the soft mask 101 is applied only to the areas of the workpiece 100 that have been implanted to form the n+ back surface fields 204. This measurement may use, for example, a charge-coupled device (CCD) camera or other camera system. A reflective laser system, light emitting diode (LED) reflective system, or IR system also may be used. Images at several locations on the workpiece 100 may be obtained and pattern recognition may be used to locate the n+ back surface field 204 using, for example, the amorphized regions of the workpiece 100 or a fiducial.

Figure 2D:
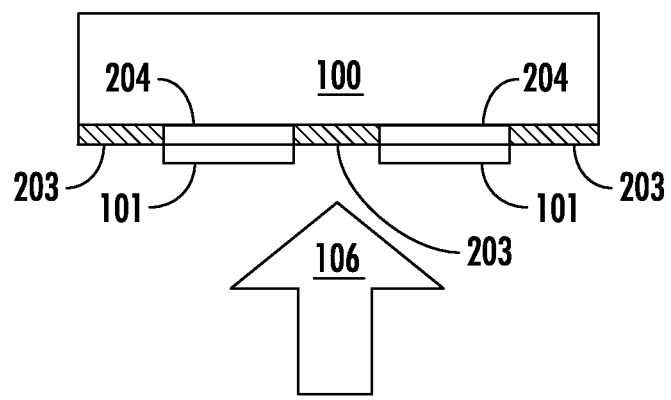
Figure 2E:
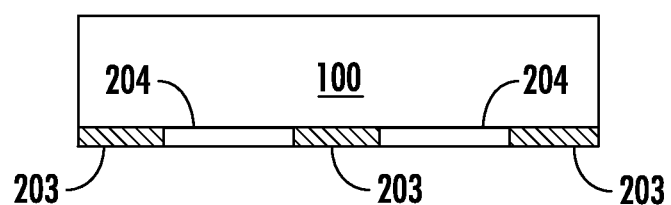

In FIG. 2D, the workpiece 100 is implanted with ions of a p-type species 106. In one embodiment, the p-type species 106 is boron, aluminum, or gallium. The soft mask 101 prevents implantation of the n+ back surface fields 204 by a portion of the p-type species 106 and the p-type species 106 instead forms the p+ emitters 203. This portion of the p-type species 106 that is blocked by the soft mask 101 may be more than 50%, more than 75%, more than 90%, or 100%. The soft mask 101 is removed in FIG. 2E. This removal may be a wet process, a rinse, an etching step, an ashing step, or a plasma-enhanced chemical process. In one embodiment, the soft mask 101 is removed using a rinse of a dilute alcohol, such as isopropyl alcohol. The p+ emitters 203 and n+ back surface fields 204 are complementary or aligned using this method.

While a particular embodiment is disclosed in FIGS. 2A-E, the reverse process also may be performed. Thus, the p+ emitters 203 may be implanted first and the soft mask 101 may be placed on these p+ emitters 203. FIGS. 3A-E are cross-sectional views of a second method to form an IBC solar cell.

Figure 3A:
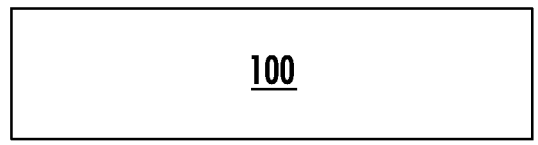
FIGS. 3A-E are cross-sectional views of a second method to form an IBC solar cell.
Figure 3B:
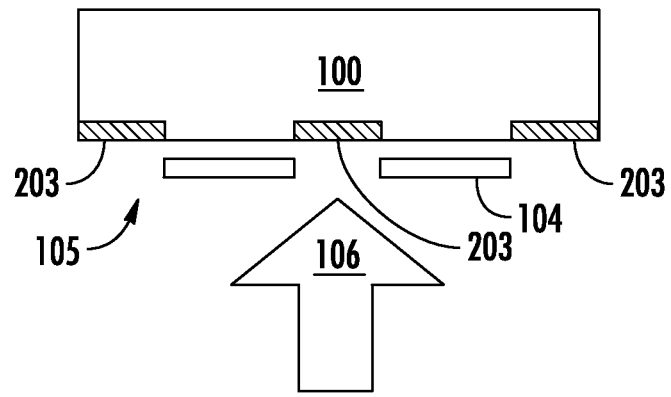

In FIG. 3A, a workpiece 100 is provided. The workpiece 100 may be, for example, a silicon substrate that will be formed into a solar cell. In FIG. 3B, the workpiece 100 is implanted using ions of a p-type species 106. The p-type species 106 is implanted through the apertures 105 of a mask 104. The mask 104 may be a stencil or shadow mask, for example, and may be disposed a distance from the workpiece 100. The mask 104 also may be disposed on the workpiece 100. This mask 104 prevents p-type species 106 from implanting the workpiece 100 except in the areas of the p+ emitters 203. In one embodiment, the p-type species 106 is implanted at a dose of approximately $1E14$ $cm^{-2}$ to $2E16$ $cm^{-2}$. Such an implant may amorphize the crystal lattice of the workpiece 100 in the p+ emitters 203 in one instance. If amorphization occurs, the p+ emitters 203 may be visible to either the human eye or to a pattern recognition system. In another instance, amorphization does not occur, but the p+ emitters 203 may still be visible with certain pattern recognition systems. These pattern recognition systems may use, for example, light in the UV or IR ranges or light in different colors to find the p±emitters 203.

Figure 3C:
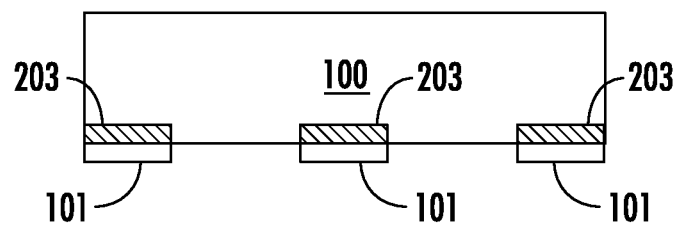

In FIG. 3C, a soft mask 101, which may be an organic material applied to the workpiece 100, is aligned to the p+ emitters 203. This soft mask 101 may be applied using, for example, an inkjet printer, a screen printer, or a rubber stamp. The application of the soft mask 101 occurs in a single step in one embodiment. Thus, this soft mask 101 may be applied in the exact shape of the p+ emitters 203 without extra patterning steps. Thermal curing or UV curing of the soft mask 101 may harden it, though in other embodiments the soft mask 101 may cool or dry and harden.

In one particular embodiment, the position of the amorphized p+ emitters 203 are optically measured and the soft mask 101 is applied only to the areas of the workpiece 100 that have been implanted to form the p+ emitters 203. This measurement may use, for example, a CCD camera or other camera system. A reflective laser system, LED reflective system, or IR system also may be used. Images at several locations on the workpiece 100 may be obtained and pattern recognition may be used to locate the p+ emitters 203 using, for example, the amorphized regions of the workpiece 100 or a fiducial.

Figure 3D:
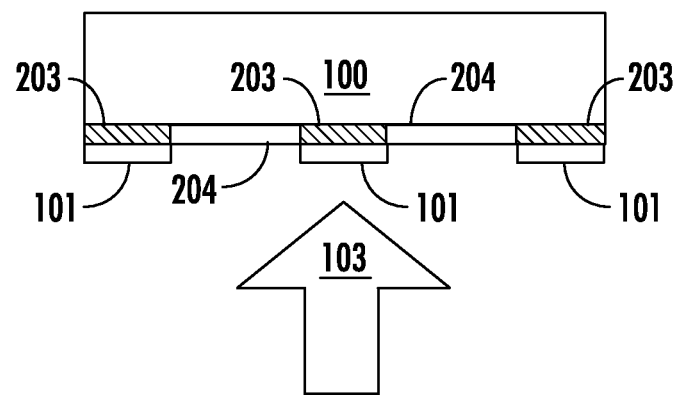
Figure 3E:
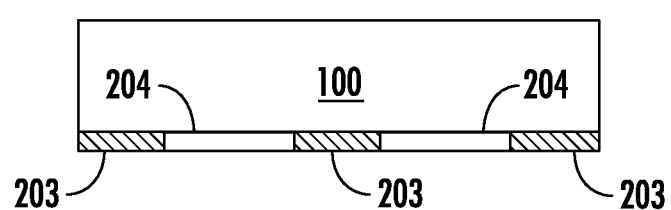
Figure 4A:
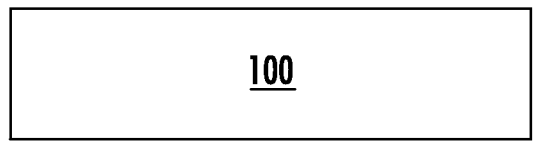
FIGS. 4A-E are cross-sectional views of a third method to form an IBC solar cell.
Figure 4B:
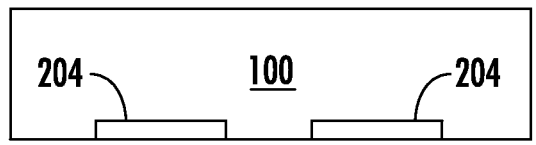
Figure 4C:
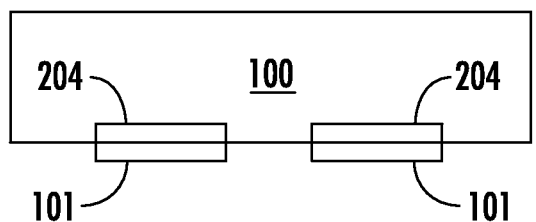
Figure 4D:
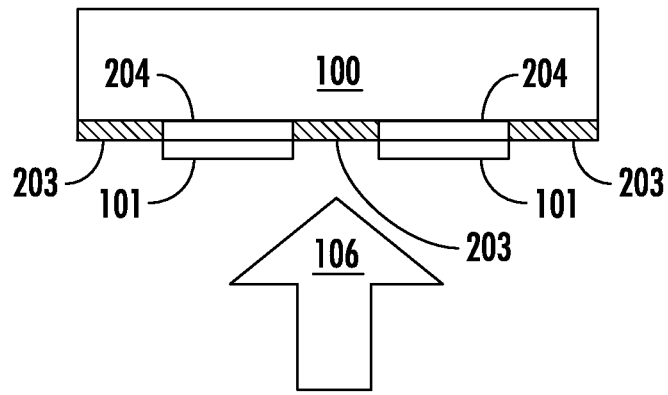
Figure 4E:
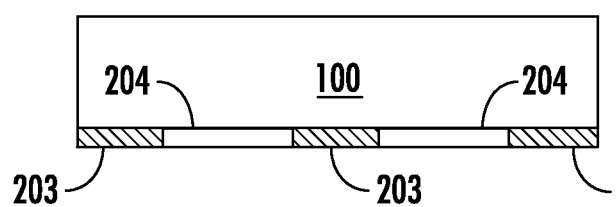

In FIG. 3D, the workpiece 100 is implanted with ions of an n-type species 103. The soft mask 101 prevents implantation of the p+ emitters 203 by a portion of the n-type species 103 and the n-type species 103 instead forms the n+ back surface fields 204. This portion of the n-type species 103 that is blocked by the soft mask 101 may be more than 50%, more than 75%, more than 90%, or 100%. The soft mask 101 is removed in FIG. 3E. This removal may be a wet process, a rinse, an etching step, an ashing step, or a plasma-enhanced chemical process. The p+ emitters 203 and n+ back surface fields 204 are complementary or aligned using this method.

The embodiments of FIGS. 2A-E and 3A-E allow doped n-type and p-type regions that are complementary to one another. Embodiments of the process described herein may allow alignment of the n-type and p-type regions even if the widths of these regions are extremely small. Thus, the n-type and p-type regions are aligned and the p-n junction may be narrow due to the high dopant concentrations on either side of the junction. The n-type and p-type regions may be directly next to one another, parallel to one another, or otherwise be distinct from one another in one particular instance. In another instance, there is a gap between the n-type and p-type regions of less than approximately 100 μm. The soft mask 101 may compensate for such a gap.

While distinct p+ emitters 203 and n+ back surface fields 204 are illustrated herein, there may be some overlap between the p+ emitters 203 and n+ back surface fields 204. This overlap may be approximately 50 μm in one instance. This can be accomplished by adjusting the dimensions of the apertures 105 in the mask 104, the placement of the soft mask 101, or both.

While implantation is specifically described, certain processes herein may be accomplished using other doping methods. For example, gaseous diffusion or furnace diffusion may be used for certain steps. In another instance, laser doping may be used for the selective doping step instead of ion implantation through a mask. Laser doping may selectively heat a paste applied to the workpiece to form doped regions in a particular pattern. The selective implantation of the species also may use a focused ion beam, which may or may not use a mask similar to the mask 104. Thus, other methods known to those skilled in the art may be used.

FIGS. 4A-E are cross-sectional views of a third method to form an IBC solar cell. FIGS. 4A-E are similar to the embodiment of FIGS. 2A-E except that in FIG. 4B the workpiece 100 is selectively doped using ions of an n-type species 103. In this embodiment, the n+ back surface fields 204 may be formed using laser doping, a focused ion beam, or a system that modulates a plasma sheath. While a particular embodiment is disclosed in FIGS. 4A-E, the reverse process also may be performed. Thus, the p+ emitters 203 may be doped first similar to FIGS. 3A-E using laser doping, a focused ion beam, or a system that modulates a plasma sheath and the soft mask 101 may be placed on these p+ emitters 203.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of manufacturing a workpiece comprising:
    selectively doping a first species into a workpiece to form a plurality of first doped regions in a surface of said workpiece, wherein said first doped regions occupy less than an entirety of said surface of said workpiece;
    optically determining a position of said first doped regions after said first species is selectively doped;
    applying a soft mask to said first doped regions using said position such that said soft mask is aligned to said first doped regions;
    implanting a second species into said surface of said workpiece after applying said soft mask, wherein said second species forms a plurality of second doped regions and wherein said soft mask blocks a portion of said second species; and
    removing said soft mask after implanting said second species.

2. The method of claim 1, wherein said workpiece is a solar cell.

3. The method of claim 1, wherein said selectively doping comprises laser doping.

4. The method of claim 1, wherein said selectively doping comprises using a focused plasma system or a system that modulates a plasma sheath.

5. The method of claim 1, wherein said selectively doping comprises implanting through a mask defining a plurality of apertures, wherein said mask is disposed a distance apart from said workpiece.

6. The method of claim 1, wherein one of said first species and said second species is an n-type species and the other of said first species and said second species is a p-type species.

7. The method of claim 6, wherein said n-type species is selected from the group consisting of P and As and said p-type species is selected from the group consisting of B, Al, and Ga.

8. The method of claim 1, wherein said first doped regions and said second doped regions are adjacent each other and complementary across said surface.

9. The method of claim 1, further comprising amorphizing said workpiece with said first species.

10. The method of claim 1, wherein said soft mask comprises an organic material.

11. The method of claim 1, wherein said soft mask is only applied to said first doped regions and an entirety of said first doped regions is covered by said soft mask.

12. A method of manufacturing a workpiece comprising:
    selectively implanting an n-type species into a workpiece through a mask defining a plurality of apertures, said mask disposed a distance apart from said workpiece, wherein said n-type species forms a plurality of first implanted regions that occupy less than an entirety of a surface of said workpiece;
    optically determining a position of said first implanted regions after said n-type species is selectively implanted;
    applying a soft mask to said first implanted regions using said position such that said soft mask is aligned to said first implanted regions;

implanting a p-type species into said surface of said workpiece after applying said soft mask, wherein said p-type species forms a plurality of second implanted regions and wherein said soft mask blocks a portion of said p-type species; and removing said soft mask after implanting said p-type species.

13. The method of claim 12, wherein said workpiece is a solar cell.

14. The method of claim 12, wherein said first implanted regions and said second implanted regions are adjacent each other and are complementary across said surface.

15. The method of claim 12, further comprising amorphizing said workpiece with said n-type species.

16. The method of claim 12, wherein said soft mask comprises an organic material.

17. The method of claim 12, wherein said n-type species is selected from the group consisting of P and As and said p-type species is selected from the group consisting of B, Al, and Ga.

18. The method of claim 12, wherein said soft mask is only applied to said first implanted regions and an entirety of said first implanted regions is covered by said soft mask.

19. A method of manufacturing a workpiece comprising:

selectively implanting a p-type species into a workpiece through a mask defining a plurality of apertures, said mask disposed a distance apart from said workpiece, wherein said p-type species forms a plurality of first implanted regions that occupy less than an entirety of a surface of said workpiece;

optically determining a position of said first implanted regions after said p-type species is selectively implanted;

applying a soft mask to said first implanted regions using said position such that said soft mask is aligned to said first implanted regions;

implanting an n-type species into said surface of said workpiece after applying said soft mask, wherein said n-type species forms a plurality of second implanted regions and wherein said soft mask blocks a portion of said n-type species; and removing said soft mask after implanting said n-type species.

20. The method of claim 19, wherein said workpiece is a solar cell.

21. The method of claim 19, wherein said first implanted regions and said second implanted regions are adjacent each other and are complementary across said surface.

22. The method of claim 19, further comprising amorphizing said workpiece with said p-type species.

23. The method of claim 19, wherein said soft mask comprises an organic material.

24. The method of claim 19, wherein said n-type species is selected from the group consisting of P and As and said p-type species is selected from the group consisting of B, Al, and Ga.

25. The method of claim 19, wherein said soft mask is only applied to said first implanted regions and an entirety of said first implanted regions is covered by said soft mask.

* * * * *